(12) United States Patent
Park et al.

(10) Patent No.: US 7,815,999 B2
(45) Date of Patent: Oct. 19, 2010

(54) INSULATED CONDUCTIVE PARTICLES AND ANISOTROPIC CONDUCTIVE ADHESIVE FILM CONTAINING THE PARTICLES

(75) Inventors: Jin Gyu Park, Seoul (KR); Tae Sub Bae, Suwon-si (KR); Jung Bae Jun, Gunpo-si (KR); Jae Ho Lee, Yongin-si (KR); Jae Geun Hong, Seoul (KR)

(73) Assignee: Cheil Industries, Inc., Gumi-shi, Gyungsangbuk-do (KR)

( * ) Notice: Subject to any disclaimer, the term of this patent is extended or adjusted under 35 U.S.C. 154(b) by 866 days.

(21) Appl. No.: 11/595,574

(22) Filed: Nov. 10, 2006

(65) Prior Publication Data

US 2007/0059503 A1 Mar. 15, 2007

Related U.S. Application Data

(63) Continuation-in-part of application No. PCT/KR2004/001173, filed on May 18, 2004.

(30) Foreign Application Priority Data

May 12, 2004 (KR) ...................... 10-2004-0033282

(51) Int. Cl.
| | | |
|---|---|---|
| B32B 5/16 | (2006.01) | |
| B32B 19/00 | (2006.01) | |
| B32B 9/00 | (2006.01) | |
| B05D 1/12 | (2006.01) | |
| B05D 1/36 | (2006.01) | |
| B05D 7/00 | (2006.01) | |

(52) U.S. Cl. ...................... 428/323; 428/327; 428/331; 428/357; 428/403; 428/407; 427/180; 427/201; 427/203; 427/212

(58) Field of Classification Search ........................ None
See application file for complete search history.

(56) References Cited

U.S. PATENT DOCUMENTS 6,042,894 A 3/2000 Goto et al.

6,699,351 B2 3/2004 Yamaguchi et al.
7,291,393 B2 * 11/2007 Wakiya et al. .............. 428/403

FOREIGN PATENT DOCUMENTS

| JP | 58-223953 | 12/1983 |
|---|---|---|
| JP | 62-40183 | 2/1987 |
| JP | 62-176139 | 8/1987 |
| JP | 02-204917 | 8/1990 |
| JP | 03-046774 | 2/1991 |
| JP | 04-174980 | 6/1992 |
| JP | 04-259766 | 9/1992 |
| JP | 06-339965 | 12/1994 |
| JP | 06-349339 | 12/1994 |
| JP | 07-105716 | 4/1995 |
| JP | 10-134634 | 5/1998 |
| JP | 11-348178 | 12/1999 |
| JP | 2001-164232 | 6/2001 |
| JP | 2001-195921 | 7/2001 |
| JP | 2003-313459 | 11/2003 |
| WO | WO03/025955 | * 3/2003 |

OTHER PUBLICATIONS

International Search Report (International Application No. PCT/KR2004/001173).

* cited by examiner

*Primary Examiner*—Sheeba Ahmed
(74) *Attorney, Agent, or Firm*—Lee & Morse, P.C.

(57) ABSTRACT

An insulated conductive particle for an anisotropic conductive film is disclosed. One embodiment of the particle includes a conductive particle and insulating fixative particles discontinuously fixed on the surface of the conductive particle. The insulating particles provides insulation with other adjacent insulated conductive particles, while the insulated conductive particle is electrically connected between electrodes with the insulating fixative particles being deviated from its position. The instant disclosure also provides a method for manufacturing the insulated conductive particle, an anisotropic conductive adhesive film containing the insulated conductive particles, and an electrically connected structure using the film.

20 Claims, 7 Drawing Sheets

(a)

(b)

(a)

(b)

(c)

(a)

(b)

INSULATED CONDUCTIVE PARTICLES AND ANISOTROPIC CONDUCTIVE ADHESIVE FILM CONTAINING THE PARTICLES

CROSS-REFERENCE TO RELATED APPLICATIONS

This application is a continuation-in-part application under 35 U.S.C. §365 (c) claiming the benefit of the filing date of PCT Application No. PCT/KR2004/001173 designating the United States, filed May 18, 2004 and published in English as WO 2005/109447 on Nov. 17, 2005. The PCT Application claims the benefit of the earlier filing date of Korean Patent Application No. 10-2004-0033282, filed May 12, 2004. The contents of the Korean Patent Application No. 10-2004-0033282 and the International Application No. PCT/KR2004/001173 are incorporated herein by reference in their entirety.

BACKGROUND

1. Field

The present invention relates to an anisotropic conductive film forming composition. More particularly, the present invention relates to an anisotropic conductive film forming composition including insulated conductive particles.

2. Description of the Related Technology

Recently, an anisotropic conductive film (ACF) has been widely used to electrically connect electronic components. An anisotropic conductive film is typically interposed between two circuits and provides multiple electrical connections between the two circuits. For example, an anisotropic conductive film is interposed between a display pixel array and an array of circuits facing the display pixel array.

For example, in a typical LCD packaging technique, such as a COF (chip-on-film) method, an anisotropic conductive film serves as an electrical connection medium between an LCD panel and a printed circuit board (PCB). An anisotropic conductive film may also be used for connection of a flexible printed circuit board (FPC) to a PCB. In addition, for the next generation packaging process, it has been proposed to connect a driver IC bare chip to an ITO pattern formed on a LCD glass panel directly by means of ACF.

SUMMARY OF CERTAIN INVENTIVE ASPECTS

One aspect of the invention provides an insulated conductive particle that can easily deviate from insulating means thereon, and then has excellent reliability in electrical connection in the direction of z-axis. Another aspect of the invention provides an anisotropic conductive particle that can prevent neighboring insulated conductive particles from aggregation. Still another aspect of the invention provides an anisotropic conductive particle that can prevent short between neighboring bump electrodes or wired circuit patterns, and then has excellent reliability in electrical insulation in the direction of xy-plane.

Still another aspect of the invention provides an anisotropic conductive particle that is suitable for fine-pitched wired circuit patterning and rapid hardening at low temperature of an anisotropic conductive adhesive. Still another aspect of the invention provides a method for preparing an anisotropic conductive particle. Still another aspect of the invention provides an anisotropic conductive film comprising insulated conductive particles. Still another aspect of the invention provides an electrically connected structure comprising an anisotropic conductive film having insulated conductive particles.

Another aspect of the invention provides an anisotropic conductive film forming composition, comprising: a matrix comprising a film forming composition; a plurality of conductive particles dispersed in the matrix; and a plurality of nonconductive particles attached to a surface of at least one of the conductive particles, wherein at least part of the plurality of nonconductive particles comprises a core and a coating layer over the core, and wherein the coating layer partially exposes the core.

The matrix may comprise: a body-forming resin; a polymerizable compound configured to cross-link the body-forming resin upon polymerization; and a polymerization initiator. The conductive particles may be generally spherical having a diameter between about 2 µm and about 10 µm. The at least one of the conductive particles may be substantially larger than the nonconductive particles attached thereto. The nonconductive particles may be generally spherical having a diameter, which is from about 1/30 to about 1/5 of the diameter of the at least one of the conductive particles.

A density of the nonconductive particles on the surface of the at least one of the conductive particles may be in a range of about 1 to about 550 E.A/µm². The at least part of the nonconductive particles may have an aspect ratio of less than about 1.5. The at least part of the nonconductive particles may have a coefficient of variation of less than about 30%. The coating layer may be interposed between the core and the surface of the at least one of the conductive particles.

The core may comprise at least one material selected from the group consisting of silica, divinylbenzene, 1,4-divinyloxybutan, divinylsulfone, diallylphthalate, diallylacrylamide, triallyl(iso)cyanurate, triallyltrimellitate, (poly)ethylene glycol, di(meth)acrylate, (poly)propylene glycol, di(meth)acrylate, pentaerythritol tetra(meth)acrylate, pentaerythlytol tri(meta)acrylate, pentaerythritol di(meth)acrylate, trimethylolpropane tri(meta)acrylate, dipentaerythritol hexa(meth)acrylate, dipentaerythritol penta(meth)acrylate, glycerol tri(meta)acrylate, styrene, ethyl vinyl benzene, α-methylstyrene, m-chloromethylstyrene, styrene sulfonic acid, methyl(meth)acrylate, ethyl(meth)acrylate, propyl(meth)acrylate, n-butyl(meth)acrylate, isobutyl(meth)acrylate, t-butyl(meth)acrylate, 2-ethylhexyl(meth)acrylate, n-octyl(meth)acrylate, lauryl(meth)acrylate, stearyl(meth)acrylate, 2-hydroxyethyl(meth)acrylate, polyethylene glycol(meth)acrylate, methoxypolyethylene glycol(meth)acrylate, glycidyl(meth)acrylate, dimethylaminoethyl(meth)acrylate, diethylaminoethyl(meth)acrylate, vinyl acetate, vinyl propionate, vinyl butylate, vinyl ether, allyl butyl ether, allyl glycityl ether, (meth)acrylic acid, maleic acid, alkyl(meth)acrylamide, (meth)acrylonitrile, methacryloxy propyltrimethoxysilane, and methacryloxy propylethoxysilane. The coating layer may comprise a material selected from the group consisting of styrene, alkyl(metha)acrylate and (metha)acrylonitrile.

At least one of the conductive particles may comprise: a nonconductive core; and at least one conductive layer coated over the nonconductive core. The at least one conductive layer may comprise: a first layer coated over the nonconductive core, the first layer comprising a first conductive material; and a second layer coated over the first layer, the second layer comprising a second conductive material different from the first conductive material.

Another aspect of the invention provides an anisotropic conductive film comprising the composition described above. A density of the plurality of conductive particles in the film may be about 5,000 to about 80,000 E.A/mm².

Another aspect of the invention provides a method of making particles for use in an anisotropic conductive film, comprising: providing a conductive particle having a surface; providing a plurality of nonconductive particles, at least one of the nonconductive particles comprising a core and a coating layer over the core; and attaching the nonconductive particles onto the surface of the conductive particle such that the coating layer attaches the core onto the surface of the conductive particle while partially exposing the core.

Yet another aspect of the invention provides an electronic device comprising: a first circuit comprising a first electrode; a second circuit comprising a second electrode; and an anisotropic conductive film interconnecting the first and second circuits, the anisotropic conductive film comprising a polymer resin and at least one anisotropic conductive connection between the first and second electrodes, the at least one anisotropic conductive connection comprising at least one particle, the at least one particle comprising: a conductive core having a surface, and a plurality of nonconductive particles attached to the surface of the conductive core, wherein at least part of the plurality of nonconductive particles comprises a core and a coating layer over the core, wherein the coating layer partially exposes the core, wherein the conductive core electrically contacts both the first and second electrodes.

The device may comprise a display device. Two opposingly located portions of the conductive core may contact the first and second electrodes.

Another aspect of the invention provides a method of making an electronic device, comprising: providing an intermediate product of an electronic device, the intermediate device comprising first and second electrically conductive portions; placing the composition described above between the first and second electrically conductive portions; pressing the first electrically conductive portion against the second electrically conductive portion such that at least one of the plurality of nonconductive particles moves from its original position, allowing portions of the surface of the at least one of the conductive particles contact the first and second electrically conductive portions; and polymerizing at least part of the polymerizable compound.

One embodiment of the invention provides an insulated conductive particle comprising a conductive particle and insulating fixative particles discontinuously fixated on the surface of the conductive particle for insulation among other adjacent insulated conductive particles, wherein the insulated conductive particle is electrically connected between electrodes by the insulating fixative particles being deviated from their own position.

The conductive particle is coated with at least one metal layer on the surface of a polymer resin particle, and the diameter of the polymer resin particle is in the range of about 90% to about 110% of average diameter of the entire polymer resin particles. Each of the insulating fixative particles comprises a particle core and a coating layer. The diameter of each of the insulating fixative particles is about 1/30 to about 1/5 of that of the conductive particle and the fixation density of the insulating fixative particles fixated on the surface of the conductive particle are in the range of about 1 to about 550 E.A/μm². Each of the insulating fixative particles has less than about 1.5 of aspect ratio, and less than about 30% of coefficient of variation.

The particle cores are formed by one or more selected from the group consisting of a cross-linked organic polymer, silica particles and an organic/inorganic composite. The coating layer is formed of at least one polymer selected from the group consisting of styrene derivatives, alkyl(meth)acrylate and (meth)acrylonitrile.

Another embodiment of the invention provides a method for preparing an insulated conductive particle comprising the steps of: forming particle cores using a cross-linking polymerization monomer independently or using copolymer of a cross-linking polymerization monomer and a common polymerization monomer; preparing insulating fixative particles by providing particles that are components of the particle cores as seeds, and seed polymerizing radical polymerization monomer that is component of a coating layer on the surfaces of the seed particles; and fixating the insulating fixative particles on the surface of the conductive particle; wherein the insulating fixative particles are discontinuously fixated on the surface of the conductive particle by physical adhesion of the coating layer.

Still another embodiment of the invention provides an anisotropic conductive adhesive film comprising about 5,000 to about 80,000 E.A/μm² of insulated conductive particles.

Still another embodiment of the invention provides an electrical connection structure comprising a printed circuit board on which bumped electrodes are formed, an LCD panel on which wired circuit patterns are formed, and an anisotropic conductive adhesive film comprising insulated conductive particles on which a plurality of insulating fixative particles are fixated, wherein the anisotropic conductive adhesive film is thermally compressed between the printed circuit board and the LCD panel.

DETAILED DESCRIPTION OF EMBODIMENTS

Figure 1:
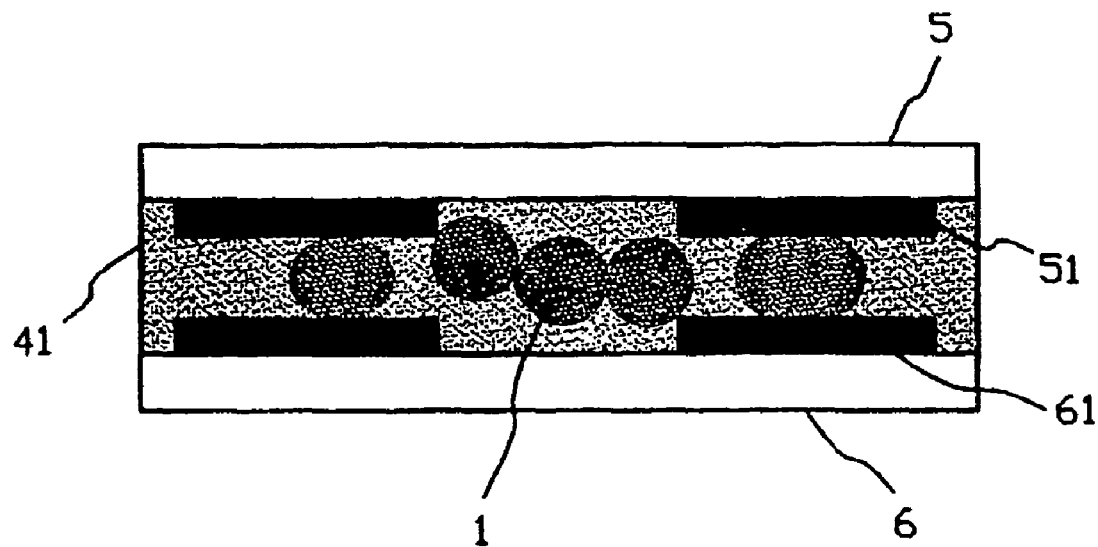
FIG. 1 is a cross-sectional view showing a short phenomenon that occurs between bumped electrodes or wired circuit patterns where an anisotropic conductive film containing conductive particles is interposed between the electrodes or patterns.

Various aspects and features of the invention will become more fully apparent from the following description and appended claims taken in conjunction with the foregoing drawings. In the drawings, like reference numerals indicate identical or functionally similar elements.

An anisotropic conductive film is typically formed by curing an anisotropic conductive film forming composition. The composition includes a body-forming resin, a polymerizable compound, a polymerization initiator, and conductive particles. Typically, the composition is in a film form, and is positioned between two electrodes. Then, a pressure is applied onto one electrode against the other while heating the film. During this process, conductive particles dispersed in the resin form anisotropic electrical connections between the two electrodes and the polymerizable compound goes through polymerization initiated by the polymerization initiator. The polymerizable compound cross-links the body-forming resin, which sustains the anisotropic electrical connections. Typically, the anisotropic conductive film is conductive only in a direction extending between the electrodes through the conductive particles, while the film is insulative in a direction perpendicular to the direction extending between the electrodes. In the context of this document, an anisotropic conductive film (ACF) may interchangeably refer to either a film-shaped anisotropic conductive film forming composition or a cured film having anisotropic connections.

Recently, wired patterns and bumped electrodes on a printed circuit board of the liquid crystal display (LCD) packaging have more and more fine pitch. Thus, there are a lot of studies whose purposes are to make the diameter of the conductive particles smaller and to increase the particle content. Further, other studies are going on to improve the reliability of conduction between the substrates.

However, such increase in the conductive particle content causes the particles between bump electrodes or between wired patterns to aggregate themselves. An undesired short then occurs in the direction of xy-plane due to a bridge resulting from aggregation between neighboring particles. Therefore, there are some restrictions to increase the conductive particle content in the insulated adhesive film or paste in view of dispersion.

To overcome the above-mentioned problem, various methods have been proposed. Japanese Patent Application Laid-Open Publication Nos. S62-40183, S62-176139, H03-46774, H04-174980, H07-105716, 2001-195921 and 2003-313459 disclose methods that cover entirely or partially the surface of a conductive particle with an insulation covering material such as an insulated polymer by means of microcapsule, spray-drying, coacervation, electrostatic discharged coating, metathesis polymerization, physical/mechanical hybridization and so on. Moreover, Japanese Patent Laid-Open Publication No. H02-204917 discloses a conductive particle having an electrically insulating layer on its surface made by coating or a metal oxide insulation layer.

In case of the conductive particles coated with insulating resin on their surface such as those of Japanese Patent Laid-Open Publication No. S62-40183, the anisotropic conductive film establishes electrical connection by collapse of the insulating layer so that the conductive layer is exposed when the anisotropic conductive film is heated and pressurized.

Japanese Patent Laid-Open Publication Nos. S58-223953, H06-339965, H06-349339 and 2001-164232 disclose anisotropic conductive adhesive sheets containing a conductive particle including insulating organic or inorganic particles and an insulating fibrous filler to prevent aggregation of the conductive particles and hence to improve reliability in the electrical connection.

The inventors have developed an anisotropic conductive film preventing aggregation of the conductive particles and having improved reliability in electrical connection and in insulation by introducing an insulated conductive particle with insulating fixative particles formed on the surface thereof. The insulating particles can deviate from their original positions so as to provide an anisotropic conductive connection between two electrodes.

FIG. 1 shows an electrical short that occurs between bumped electrodes or wired circuit patterns where an anisotropic conductive film containing conductive particles 1 is interposed between the electrodes or patterns.

In FIG. 1, conductive particles 1 aggregate with one another when a printed circuit board 5 is electrically connected with an LCD panel 6 by an insulated adhesive 41 which contains the conductive particles 1. Such aggregation causes a short circuit between a bump electrode 51 and a neighboring wired circuit pattern 61, and then brings a falling-off in reliability of electrical connection and insulation.

Figure 2:
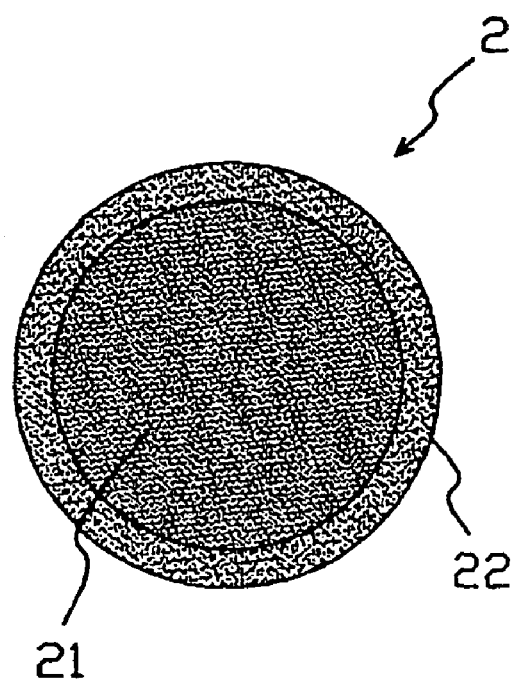
FIG. 2 is a cross-sectional view showing an insulated conductive particle comprising a conductive particle on which insulating material is formed.

FIG. 2 shows an insulated conductive particle 2 including a conductive particle 21 and an insulating material 22 formed on the surface thereof. As shown in FIG. 2, an insulation layer 22 serves to prevent aggregation with other conductive particles, thereby preventing electrical short between conductive particles. Such insulated conductive particles may be used to form electrical connection with a bumped electrode as described below.

Figure 3:
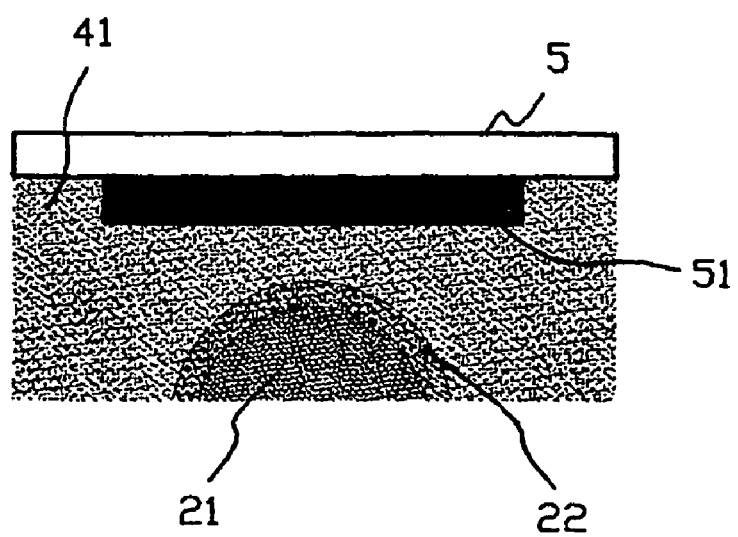
FIG. 3 is a cross-sectional view showing insulated conductive particles connected on a bumped electrode of a substrate. Disconnection is shown in (a) and connection in (b).
Figure 3:
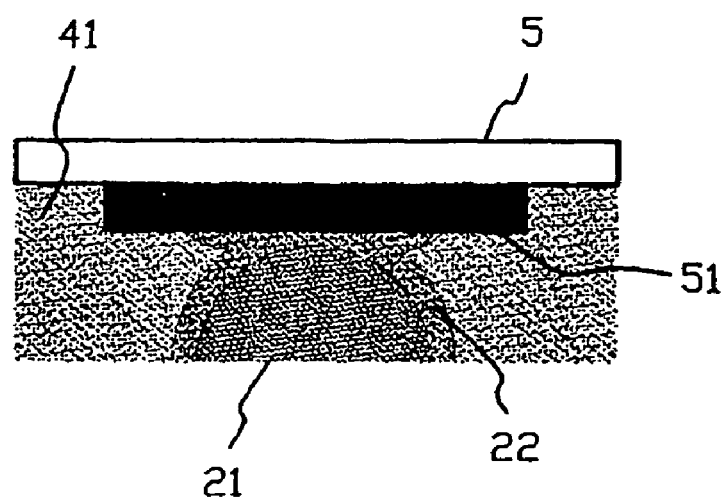

FIG. 3 shows insulated conductive particles 21 connected to a bumped electrode 51 of a printed circuit board 5. When an anisotropic conductive film is compressed between the electrodes of substrates, the insulation layer 22 of the insulated conductive particle 21 is physically degraded as shown in (b) and then the conductive particle 21 is electrically connected to the bumped electrode 51. In this case, the degraded insulation layer 22 needs to be removed from the contacting surface of the conductive particle 21 so as to allow electrical connection between the conductive particle and the bumped electrode 51. However, if the degradation of the insulation layer 22 is not sufficient, reliability in electrical connection decreases. In order to improve reliability in electrical connection, more insulated conductive particles can be interposed between electrodes. However, insulation and connection reliability may decrease due to the finer pitch among circuit patterns.

Figure 4:
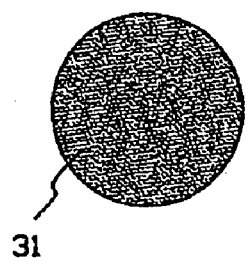
FIG. 4 shows each of particles used in one embodiment. A conductive particle is shown in (a), insulating fixative particles in (b), and an insulated conductive particle in (c).
Figure 4:
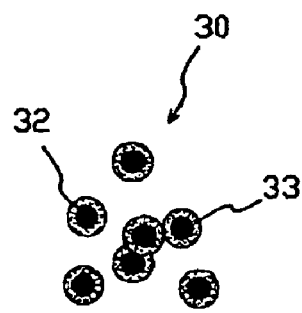
Figure 4:
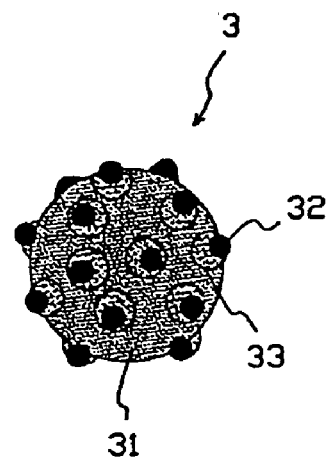

FIG. 4 illustrates one embodiment of an insulated conductive particle. A conductive particle 31 serving as a core is shown in FIG. 4(a). Insulating fixative particles 30 to be fixed on the surface of the conductive particle 31 are shown in FIG. 4(b). FIG. 4(c) illustrates an insulated conductive particle 3 including the conductive particle 31 and the insulating fixative particles 30 fixed on the surface of the conductive particle 31.

In one embodiment, an insulated conductive particle 3 includes a conductive particle 31, and insulating fixative particles 30 fixated discontinuously on the surface of the conductive particle 31. Each of insulating fixative particles includes a particle core 32 and a coating layer 33. The coating layer 33 may be insoluble in insulation adhesive 41 (FIG. 1). The insulating fixative particles may be fixed on the conductive particle 31 using physical/mechanical hybridization.

In one embodiment, the conductive particle 31 may be a spherical metal particle. In certain embodiments, the conductive particle 31 may be formed by electroless plating on the surface of a polymer resin particle with nickel (Ni) and gold (Au) successively. Au plating is conducted after Ni plating. In such embodiments, various other conductive metals such as palladium (Pd) and silver (Ag) may be used in place of Au. In one embodiment, the conductive particle 31 is a mono-dispersed particle with a diameter of about 2 to about 10 μm. The diameter of the polymer resin particle may be in a range of about 90 to about 110% of average diameter of the polymer resin particles.

The insulating fixative particle 30 includes a particle core 32 and a coating layer 33 that has insolubility with an insulation adhesive. As used herein, the term "hard" refers to a property that its shape is not deformed by external force, impact, friction and so on, when applying physical/mechanical hybridization. In addition, the term may also refer to being insoluble with an insulation adhesive or other solvents. The coating layer 33 may be degraded by physical or mechanical external force. The coating layer 33 may be insoluble with an insulation adhesive.

The insulating fixative particles 30 may be prepared by preparing a hard particle for the particle cores 32 and preparing the coating layer 33 by seed polymerization on the particle cores 32 to be a composite. The resulting insulating fixative particles 30 are fixed on the surface of the conductive particle 31 by physical/mechanical hybridization.

In one embodiment, an average diameter of the insulating fixative particles 30 is about 1/30 to about 1/5 of that of the conductive particle 31. A density of the insulating fixative particles on the surface of the conductive particle 31 is in a range of about 1 to about 550 E.A/$\mu m^2$. Each of the insulating fixative particles 30 has an aspect ratio of less than about 1.5, and a coefficient of variation of less than about 30%. As used herein, the term "aspect ratio" refers to a ratio of a maximum diameter to a minimum diameter of a single particle. The term "coefficient of variation" refers to a standard deviation of the particle size divided by the average diameter. The detailed process of fixing the insulating fixative particle 30 on the surface of the conductive particle 31 is described as below.

Fixative Particles

The insulating fixative particles 30 may be prepared by forming particle cores 32 and then forming a layer 33 coated over the particle cores 32. The coating layer 33 may be formed by seed polymerization. The coating layer 33 may completely surround the particle cores 32 or at least partly cover the surface of the particle cores 32. The particle cores 32 may be formed of cross-linked polymer particles, inorganic particles, or organic/inorganic composite particles.

The cross-linked polymer particles forming the particle cores 32 may be formed from a cross-linking polymerization monomer or a copolymer. The copolymer may be formed by copolymerization of a cross-linking polymerization monomer and at least one kind of common polymerization monomer. The polymerization includes emulsion polymerization, non-emulsion polymerization, or dispersion polymerization.

Examples of the cross-linking polymerization monomer, which may be radically polymerized, include, but are not limited to, an allyl compound such as divinylbenzene, 1,4-divinyloxybutan, divinylsulfone, diallylphthalate, diallylacrylamide, triallyl(iso)cyanurate, and triallyltrimellitate, and acrylic compound such as (poly)ethylene glycol, di(meth)acrylate, (poly)propylene glycol, di(meth)acrylate, pentaerythritol tetra(meth)acrylate, pentaerythlytol tri(meta)acrylate, pentaerythritol di(meth)acrylate, trimethylolpropane tri(meta)acrylate, dipentaerythritol hexa(meth)acrylate, dipentaerythritol penta(meth)acrylate and glycerol tri(meta)acrylate.

Examples of the common polymerization monomer, which also may be radically polymerized, include, but are not limited to, a styrene monomer such as styrene, ethyl vinyl benzene, α-methylstyrene, m-chloromethylstyrene, and styrene sulfonic acid, methyl(meth)acrylate, ethyl(meth)acrylate, propyl(meth)acrylate, n-butyl(meth)acrylate, isobutyl(meth) acrylate, t-butyl(meth)acrylate, 2-ethylhexyl(meth)acrylate, n-octyl(meth)acrylate, lauryl(meth)acrylate, stearyl(meth)acrylate, 2-hydroxyethyl(meth)acrylate, polyethylene glycol (meth)acrylate, methoxypolyethylene glycol(meth)acrylate, glycidyl(meth)acrylate, dimethylaminoethyl(meth)acrylate, diethylaminoethyl(meth)acrylate, vinyl acetate, vinyl propionate, vinyl butylate, vinyl ether, allyl butyl ether, allyl glycityl ether, unsaturated carboxylic acid including (meth)acrylic acid or maleic acid, alkyl(meth)acrylamide, and (meth)acrylonitrile.

The inorganic particles forming the particle cores 32 may have a diameter of about 200 to about 800 nm. The inorganic particles may be formed of mono-dispersed silica particles and may be prepared by any suitable sol-gel method.

The organic/inorganic composite particles forming the particle cores 32 may be prepared by dispersion polymerization of a common polymerization monomer with a monomer having a silane group and an unsaturated carbon atom, and then cross-linking the silane group through a sol-gel reaction. Examples of the monomer having an unsaturated carbon atom include, but are not limited to, methacryloxy propyltrimethoxysilane and methacryloxy propylethoxysilane. The co-polymerization monomer may be any suitable monomer used to prepare the cross-linked polymeric particle, for example, styrene.

The insulating fixative particle 30 may be prepared by seed polymerization of a radical polymerization monomer, which is a component of the coating layer 33, on a seed particle. The seed includes a cross-linked polymeric particle, an inorganic particle or organic/inorganic composite particle. The coating layer 33 may be insoluble with an insulation adhesive 41. The coating layer may be degradable by external physical/mechanical force.

The coating layer 33 is formed by polymerization or copolymerization of at least one monomer selected from styrene, acrylonitrile, or acrylic monomer. That is, the coating layer 33 includes at least one polymer selected from styrene derivatives, alkyl (meth)acrylate, or (meth)acrylonitrile. The insulating fixative particle 30 may have various morphologies including core/shell, raspberry and hemisphere structures.

Fixation of Insulating Fixative Particles

The insulating fixative particles 30 may be fixed on the surface of the conductive particle 31 as described below. The method of fixation may use physical/mechanical hybridization. An exemplary method for such hybridization is disclosed in *Microcapsule*, 3rd Ed., Sankyoshuppan Kabushikikaisha, 1995, the disclosure of which is incorporated herein by reference.

This hybridization method can fix insulating fixative particles 30 on the surface of the conductive particle 31. After fixation, the coating layer 33 is degraded by hybridization whereas the particle cores 33 has no degradation or changes in its morphology. The insulating fixative particles 30 are fixed on the surface of the conductive particle 31 by physical adhesion of the coating layer 33. The insulated conductive particle 3 has a plurality of insulating fixative particles 30 on its surface. The insulating fixative particles 30 are discontinuously fixed on the surface of the conductive particle 31.

In certain embodiments, the substantially entire surface of the particle cores 32 is covered with the coating layer 33 before the fixation step. After the fixation step, however, a portion of the coating layer 33 may be removed, exposing a portion of the surface of the particle cores 32, as shown in FIG. 4 (c).

On the surface of the conductive particle 31 are fixed insulating fixative particles 30. A density of the insulating fixative particles is in a range of about 1 to about 550 E.A/μm². An average diameter of the insulating fixative particles is about 1/30 to about 1/5 of that of the conductive particle.

Figure 5:
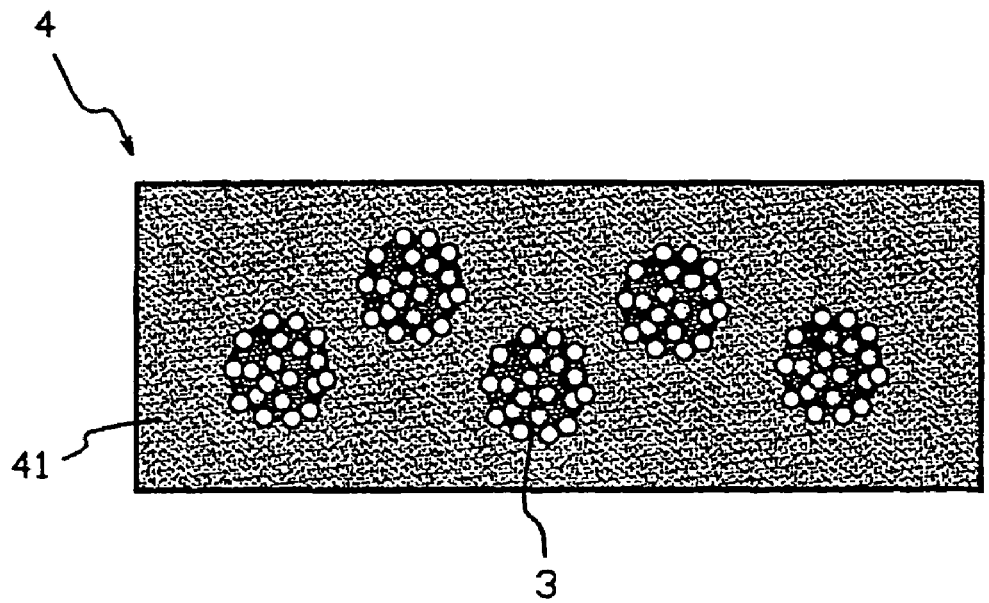
FIG. 5 is a cross-sectional view showing an anisotropic conductive film in which insulated conductive particles according to one embodiment are dispersed.

FIG. 5 shows an anisotropic conductive film 4 with insulated conductive particles 3 dispersed in an insulation adhesive 41 of the film. As shown in FIG. 5, the anisotropic conductive film 4 has the insulation adhesive 41 and insulated the conductive particles 3 dispersed therein. After the insulated conductive particles 3 are dispersed in the insulation adhesive 41, the insulated conductive particles 3 hold their morphology because insulating fixative particles 30 are fixed on the surface of the conductive particles 31 by physical adhesion of coating layer 33.

The anisotropic conductive film 4 may include an insulation adhesive 41, insulated conductive particles 3, a curing agent and additives for promoting dispersion to form a film.

The insulation adhesive 41 may include an epoxy-based resin and a resin for forming a film. The epoxy-based resin may be a polyvalent epoxy resin that contains more than two epoxy groups. Examples of the epoxy-based resin include, but are not limited to, a novolak resin such as phenol novolak and cresol novolak; a polyvalent phenol such as bisphenol A, bisphenol F and bishydroxy phenyl ether; a polyalcohol such as ethylene glycol, neopentyl glycol, glycerin, trimethylolpropane, and polypropylenegylcol; a polyamino compound such as ethylene diamine, triethylenetetra amine, and aniline; a poly carboxylic compound such as phthalic acid, isophthalic acid. The adhesive 41 may include a mixture of two or more of the foregoing compounds.

The resin for forming a film in the insulation adhesive 41 may be a resin that can easily form a film and does not react with a curing agent. The examples of the resin include, but are not limited to, an acrylic resin such as acrylate resin, ethyleneacrylate copolymer, and ethylene-acrylic acid copolymer; an olefin resin such as ethylene resin, and ethylene-propylene copolymer; a rubber such as butadiene resin, acrylonitrilebutadiene copolymer, styrene-butadiene block copolymer, styrene-butadiene-styrene block copolymer, carboxylated styrene- ethylene-butadiene styrene block copolymer, ethylene-styrene-butyl block copolymer, nitrile butadiene rubber, styrene butadiene rubber, and chloroprene rubber; a vinyl based resin such as vinyl butyral resin and vinylform resin; an ester resin such as polyester and cyanate ester; a phenoxy resin, a silicon rubber, and a urethan resin. The resin may include a mixture of two or more of the foregoing compounds.

The curing agent used in the anisotropic conductive film 4 includes a compound which contains two or more active hydrogen atoms, including, but not limited to, imidazoles, isocyanates, amines, amides, acidic anhydrides and so on. The curing agent may include a mixture of two or more of the foregoing compounds.

In one embodiment, the number of the insulated conductive particles contained in the anisotropic conductive film may be about 5,000 to about 80,000 per square millimeter (mm²), optionally about 10,000 to about 50,000 per square millimeter (mm²).

Figure 6:
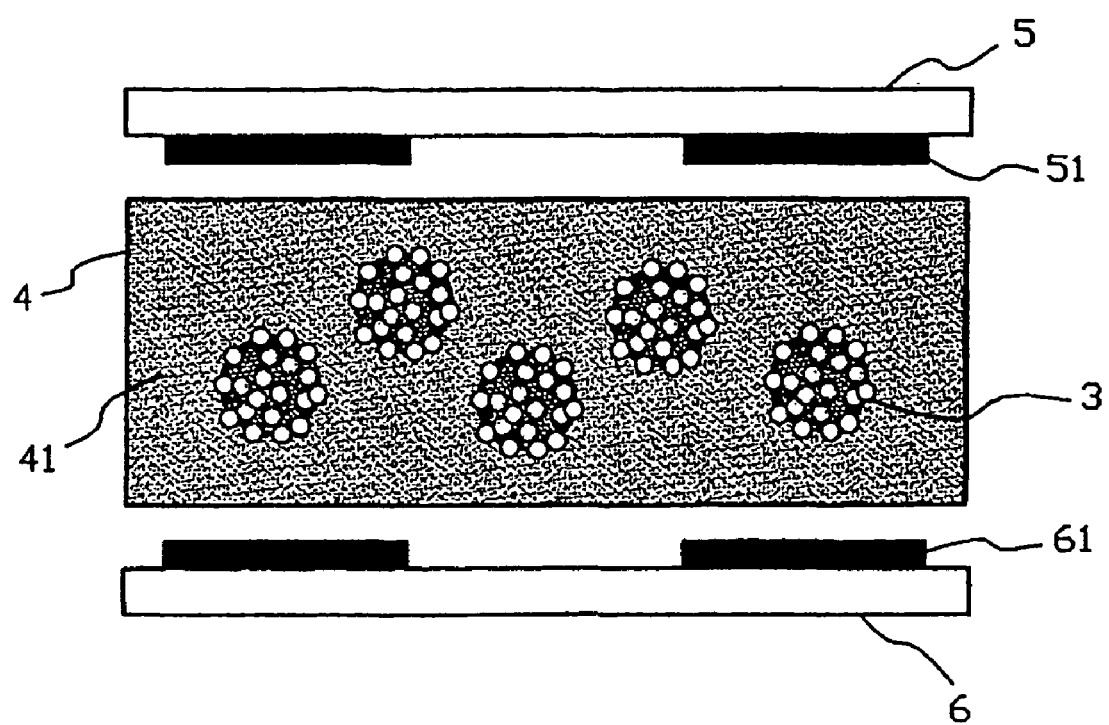
FIG. 6 is a cross-sectional view showing an anisotropic conductive film containing insulated conductive particles according to one embodiment is about to be compressed between substrates.
Figure 7:
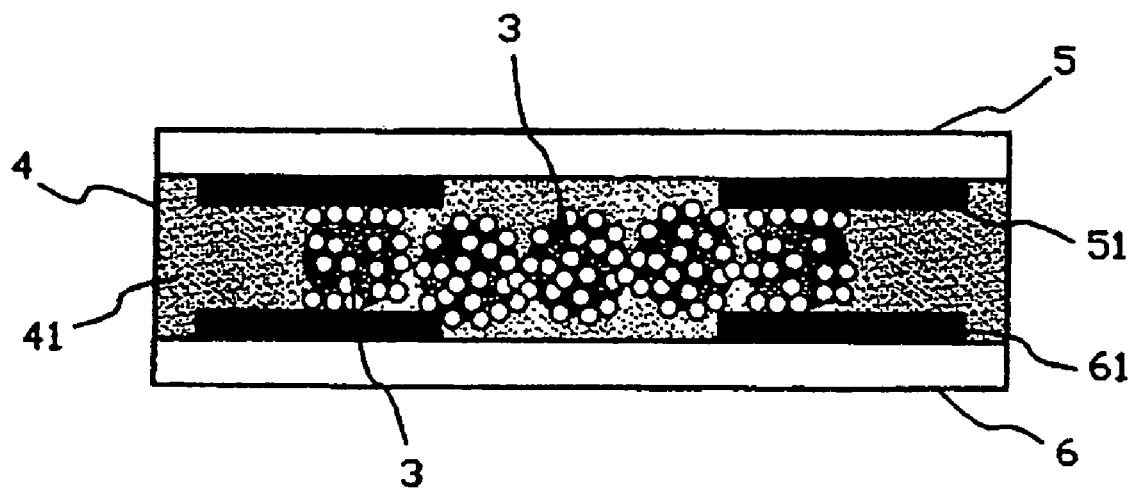
FIG. 7 shows an electrical connection structure that is electrically connected between each of electrodes and pattern by compressing an anisotropic conductive adhesive film containing insulated conductive particles according to one embodiment between substrates.

FIG. 6 shows an anisotropic conductive film 4 containing insulated conductive particles 3 according to one embodiment. The film is about to be compressed between two substrates 5, 6. FIG. 7 shows an electrical connection structure that is electrically connected between electrodes 51 and pattern 61 by an anisotropic conductive adhesive film 4 containing insulated conductive particles 3 according to one embodiment.

As shown in FIG. 6, electrical connection between printed circuit board 5 and LCD panel 6 is established by thermally compressing an anisotropic conductive adhesive film 4 that contains insulated conductive particles 3 between the circuit board 5 on which bump electrodes 51 are formed and the LCD panel 6 on which wired circuit patterns 61 are formed.

As shown in FIG. 7, an electrical connection structure includes a printed circuit board 5 on which bump electrodes 51 are formed, LCD panel 6 on which wired circuit patterns 61 are formed, and an anisotropic conductive adhesive film 4 that contains insulated conductive particles 3 which are fixed by a plurality of insulating fixative particles on the surface of a conductive particle 31. The film 4 is prepared by thermally compressing between the printed circuit board 5 and LCD panel 6.

The electrical connection structure can prevent neighboring electrodes or patterns from an undesired electrical short. Insulating fixative particles 30 fixed on the surface of each of conductive particles 31 prevent such a short although aggregation of neighboring insulated conductive particles 3 may form a bridge between neighboring electrodes or patterns after thermal compressing the anisotropic conductive adhesive film 4 between substrates 5, 6. Accordingly, an undesired electrical short between neighboring electrodes or patterns can be prevented. Thus, undesired electrical connection in the direction of xy-plane is prevented, thereby, providing highly reliable insulation. Moreover, a highly reliable electrical connection in the direction of z-axis is obtained as described below.

Figure 8:
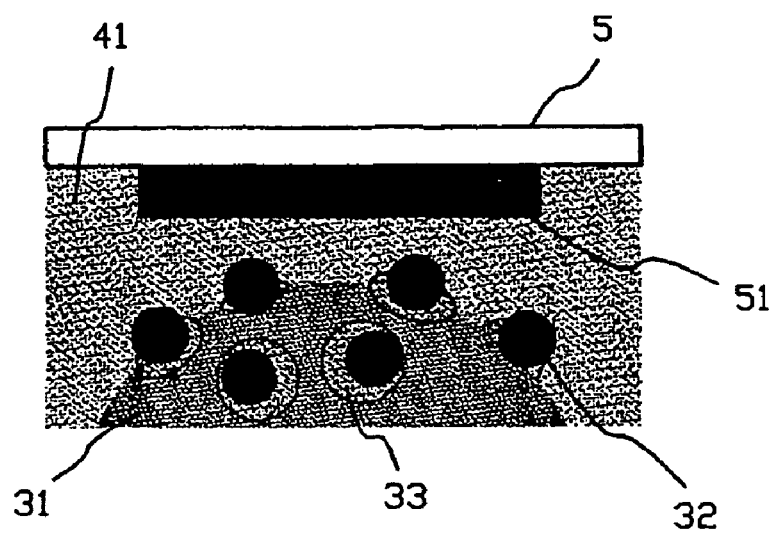
FIG. 8 is a cross-sectional view showing insulated conductive particles according to one embodiment connected on a bumped electrode of a substrate. Disconnection is shown in (a) and connection in (b).
Figure 8:
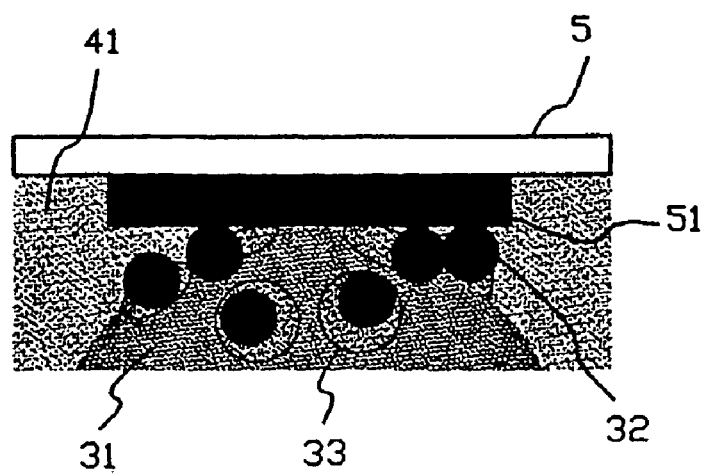

FIG. 8 shows insulated conductive particles 3 according to one embodiment connected to a bumped electrode 51 of a substrate 5. Disconnection is shown in (a) and connection in (b).

As shown in FIG. 8, when the insulated conductive particles 3 are thermally compressed between a bump electrode and printed circuit pattern, particle cores 32 held on coating layer 33 deviates from its original position such that a conductive particle 31 can contact the bump electrode 51 or the pattern 61. Accordingly, this structure results in highly reliable insulation in the direction of z-axis while providing reliable electrical connection between the conductive particle 31 and the electrode 51.

Electronic Devices

Another aspect of the invention provides an electronic device including an anisotropic conductive film (ACF). In one embodiment, the electronic device includes a first circuit, a second circuit, and an anisotropic conductive film interconnecting the first and second circuits. The anisotropic conductive film includes a cross-linked polymer resin and at least one anisotropic conductive connection between electrodes of the circuits.

The electronic device may include, but is not limited to, consumer electronic products, electronic circuits, electronic circuit components, parts of the consumer electronic products, electronic test equipments, etc. The consumer electronic products may include, but are not limited to, a mobile phone, a telephone, a television, a computer monitor, a computer, a hand-held computer, a personal digital assistant (PDA), a microwave, a refrigerator, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device may include unfinished products.

In one embodiment, the electronic device described above may be made by the following method. First, a first part of an electronic device having a first electrode is provided. Then, an ACF is provided onto the first part to cover the first electrode.

Next, a second part of the electronic device having a second electrode is provided over the first part. The second part is positioned so that the second electrode is aligned above the first electrode with the ACF interposed between the electrodes. Then, pressure is applied onto the second part against the first part. In addition, heat may be applied to the ACF. In certain embodiments, the ACF may be pressed and/or heated to a temperature of between about 60° C. and about 200° C., optionally between about 180° C. and about 200° C., for about 0.5 to about 2 seconds before being provided between the electrodes.

Referring back to FIG. 7, during the process described above, some of the insulated conductive particles 3 are positioned between the electrodes 51, 61. While the electrodes 51, 61 are pressed against each other, the electrodes 51, 61 contact the particles 3 positioned between the electrodes 51, 61. Then, some of the insulating particle cores 32 at least partially come into contact with one of the electrodes 51, 61. The electrodes 51, 61 are then further pressed against each other. The insulating particle cores 32 in contact with one of the electrodes 51, 61 are pushed away from their original positions as the electrodes 51, 61 move toward each other. This is because the coating layers 33 do not hold the particle cores 32 firmly enough on the surface of the conductive particle 31 to resist being pushed away. This configuration allows opposing portions of the surface of the conductive particle 31 to contact with the electrodes 51, 61, thereby establishing an anisotropic conductive connection between the electrodes 51, 61.

After the electrodes have been fully pressed against each other, certain insulating particle cores 32 which have moved from their original positions may remain in contact with at least one of the coating layers 33, the electrodes 51, 61, other particle cores 32, and the surface of the conductive particle 31, as shown in FIG. 8 (b). Other particle cores 32, however, may contact none of the layer 33, the electrodes 51, 61, other particle cores 32, and the conductive particle 31. On the other hand, insulating particle cores 32 which have had no contact with the electrodes 51, 61, most likely stay at their original positions, and provide insulation with a laterally neighboring particle 3.

In addition, the polymerization initiator initiates polymerization of the polymerizable compound. As a result, cross-links are formed between the body-forming resins. Since the polymerizable compounds generate thermosetting polymers and cross-links, the anisotropic electric connection maintains as the thermosetting polymers cure. This configuration maintains the established electrical connection between the electrodes of the electronic device.

The invention may be better understood by reference to the following examples which are intended for the purpose of illustration and are not to be construed as in any way limiting the scope of the present invention, which is defined in the claims appended hereto.

EXAMPLES

Example 1

In this example 1, insulated conductive particles were prepared according to the method as described below. First, methylmethacrylate (MMA) monomer and divinylbenzene (DVB) were mixed and stirred with 1 g of azobisisobutylonitrile as a fat-soluble initiator, 17.9 g of polyvinylpyrrolidone whose molecular weight is 40,000 as a dispersion stabilizer, and 877.7 g of solution containing methanol and ion-exchanged water by unity as a solvent, and then were completely dissolved in a reactor. This was held so that total weight of monomer was 100 g, DVB was applied 30.0% by weight of MMA, and then polymerization was conducted during stirring at 70° C. and 220 rpm of stirring rate, for 24 hours. The resulting poly MMA-DVD particles were separated with unreactants and dispersion stabilizer using a centrifugal separator and then were dried in a vacuum oven for 24 hours, which afforded to 400 nm of hard particles in powder form.

20 g of the prepared poly MMA-DVD particles were dispersed again in a glass reactor with 150 g of sodium lauryl sulfate (SLS) solution (0.25%) under ultrasonic wave for ten minutes and then obtained dispersants. After complete dispersion of the particles, 100 g of ultra-pure water was added, and then was heated to 72.5° C. under nitrogen atmosphere. 50 g of solution containing 0.2 g of potassium persulfate (KPS) as a water-soluble initiator was added, and 30 minutes later 20 g of monomer mixture mixed with 10 g of styrene and methlymethacrylate was dropped and polymerized for 3 hours. After dropping of the monomer, reaction continued for additional 3 hours. After unreactants and emulsifiers were removed from the prepared poly MMA-DVB/poly St-MMA core shell particles using a centrifugal separator, the particles were dried in a vacuum oven for 24 hours and then 530 nm of diameter of the insulating fixative particles were obtained in a powder form.

Figure 9:
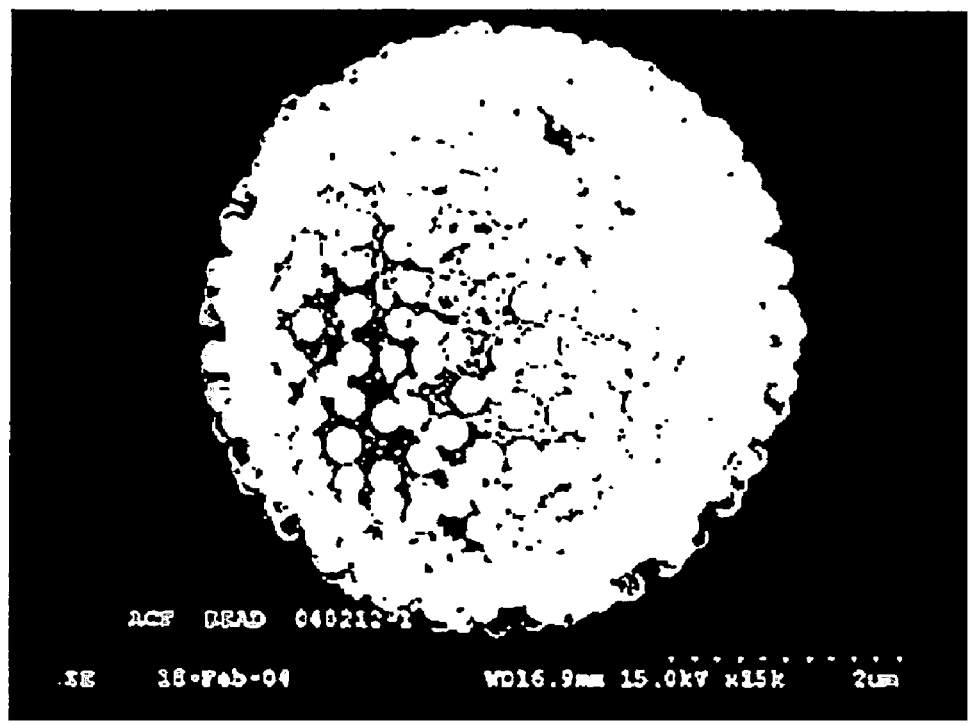
FIG. 9 shows a Scanning Electron Microscope (S.E.M.) image for an insulated conductive particle according to one embodiment.

The prepared insulating fixative particles were fixated physically/mechanically on the surface of a conductive particle whose surface was plated by Ni/Au on 4 μm an of a monodispersed acryl particle using a hybridizer made by Japanese corporation, NARA Machinery co., Ltd. The S.E.M. image of the resulting insulated conductive particles is shown in FIG. 9. Using the image, average diameter (μm) and fixation density (E.A/μm$^2$) were measured and shown in below Table 1.

Example 2

Example 2 was conducted in the same manner as in Example 1 except that insulating fixative particles were prepared as below method. First, 0.125 g of azobisisobutylonitrile as a fat-soluble initiator, 8 g of polyvinylpyrrolidone whose molecular weight is 40,000 as a dispersion stabilizer, and 76.375 g of methanol as solution and methacryloxy propyltrimethoxysilane (MOPTMS) were added to styrene monomer in a reactor with varying weight fraction over styrene monomer. The total weight of monomer was adjusted to 12.5 g and 30% by weight of propylmethoxysilane was added. The compound was stirred for several hours at room temperature. 3% of water over total weight was added and stirred with water, and then polymerization was conducted at 200 rpm and 70° C. for 24 hours with stirring. This afforded to poly styrene-silica particles. After removing the unreactants and dispersion stabilizer used in the centrifugal separator, they were dried for 24 hours in a vacuum oven to obtain 500 nm of diameter of hard particles in a powder form.

Using these resulting poly styrene-silica hybrid particles as the particle cores, poly styrene-silica/poly styrene-MMA composite particles of 690 nm of diameter were obtained according to the hybridization applied in Example 1.

Using these resulting insulating fixative particles, insulated conductive particles were prepared according to the method applied in Example 1. Average diameter (μm) and surface fixation density (E.A/μm$^2$) of the prepared particles were measured and shown in Table 1 below.

TABLE 1

| | Average Diameter (μm) | Surface fixation density (E.A/μm$^2$) |
|---|---|---|
| Example 1 | 4.85 | 4.3 |
| Example 2 | 5.12 | 3.1 |

Examples 3-7

In these Examples 3-7, anisotropic conductive films were prepared using insulated conductive particles prepared in Example 1 with the content of the particles varied. The reliability in electrical connection and insulation of IC chip with the film was evaluated.

First, the insulated conductive particles prepared in Example 1 with 15 parts by weight of Bisphenol A type epoxy resin (epoxy equivalent 6000) and 7 parts by weight of 2-methyl imidazole as a curing agent were dissolved in a solution prepared by mixing toluene and methylethyl ketone. To the mixture, 25,000 of insulated conductive particles per square millimeter (mm$^2$) and a silane coupling agent were dispersed. The resultant was coated on a releasing PET film and then dried to form a film at a thickness of 25 μm.

The anisotropic conductive films thus produced in Example 1 were displaced between an IC chip and a circuit board, whose bump height of 40 μm with the IC chip size of 6 mm×6 mm using the circuit board made of BT resin with a thickness of 0.7 μm formed wired patterns with a thickness of 8 μm (Cu—Au plating) at a pitch of 150 μm, followed by heating and pressed under the condition of 200° C. and 400 kg/cm$^2$ for 10 seconds to provide an electrical connection structure sample.

The structure sample was aged at 80° C., at a relative humidity of 85% RH for 1,000 hours, and tested to determine reliability in electrical connection by value of an increase of connection resistance. The reliability in insulation was evaluated with the bump surface area of 2,600 mm$^2$ and an increase of connection resistance value was evaluated with the three kinds of marks in Table 2. As used herein, ⊚ indicates not more than 0.1Ω, Δ more than 0.1Ω and not more than 0.3%, and x more than 0.3Ω.

Next, the reliability in insulation was evaluated with a bump size of 35 μm×75 μm at bump height of 20 μm, with an IC chip size of 6 mm×6 mm using a transparent board formed a wiring pattern by indium tin oxide in a glass state at a pitch of 65 μm and with a line of 70 μm. In this case, whether a shorting occurs or not was observed using a transparent board with a microscope. The results are shown in Table 2. As used herein, ⊚ indicates resistance increase over 109Ω, Δ in the range of 108 to 109Ω, and x not more than 108Ω.

TABLE 2

| | Examples | | | | |
|---|---|---|---|---|---|
| | 3 | 4 | 5 | 6 | 7 |
| Content of insulated conductive particles (E.A/mm$^2$) | 10,000 | 20,000 | 30,000 | 40,000 | 50,000 |
| Reliability in electrical connection | ⊚ | ⊚ | ⊚ | ⊚ | ⊚ |
| Reliability in insulation | ⊚ | ⊚ | ⊚ | ⊚ | ⊚ |

Examples 8-12

Examples 8-12 were conducted in the same manner as in Examples 3-7 except that insulated conductive particles prepared in Example 2 were used. The reliability in electrical connection and insulation of the resulting anisotropic conductive film was evaluated and shown in Table 3.

TABLE 3

| | Examples | | | | |
|---|---|---|---|---|---|
| | 8 | 9 | 10 | 11 | 12 |
| Content of insulated conductive particles (E.A/mm$^2$) | 10,000 | 20,000 | 30,000 | 40,000 | 50,000 |
| Reliability in electrical connection | ⊚ | ⊚ | ⊚ | ⊚ | ⊚ |
| Reliability in insulation | ⊚ | ⊚ | ⊚ | ⊚ | Δ |

Comparative Examples 1-3

In these Comparative Examples 1-3, anisotropic conductive films containing conductive particles with the diameter of 4 μm whose surfaces were coated styrene-acrylic resin were prepared, followed by evaluation for reliability in electrical connection and insulation in accordance with the method of Examples 3-12. The results are shown in Table 4.

Comparative Examples 4-6

Comparative examples 4-6 were conducted in the same manner as in Comparative examples 1-3 except that conductive particles coated with PVDF resin were used. The reliability in electrical connection and insulation was evaluated and shown in Table 4.

TABLE 4

| | Comparative examples | | | | | |
|---|---|---|---|---|---|---|
| | 1 | 2 | 3 | 4 | 5 | 6 |
| Content of insulated conductive particles (E.A/mm$^2$) | 20,000 | 40,000 | 50,000 | 20,000 | 40,000 | 50,000 |
| Reliability in electrical connection | Δ | Δ | Δ | Δ | Δ | Δ |
| Reliability in insulation | ⊚ | ⊚ | Δ | ⊚ | Δ | X |

As shown above Examples 3-12 and Comparative examples 1-6, the anisotropic conductive film using insulated conductive particles having insulating fixative particles fixated on each surfaces of conductive particles according to the embodiments described above may obtain higher reliability in electrical connection and insulation. In the foregoing discussions, those referred to as comparative examples do not necessarily represent prior art and the term "comparative example" does not constitute an admission of prior art.

Although certain embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. An anisotropic conductive film forming composition, comprising:
   a matrix comprising a film forming composition;
   a plurality of conductive particles dispersed in the matrix; and
   a plurality of nonconductive particles attached to a surface of at least one of the conductive particles, wherein at least part of the plurality of nonconductive particles comprises a core and a coating layer over the core, wherein the coating layer partially exposes the core, and wherein the coating layer includes a polymer.

2. The composition of claim 1, wherein the matrix comprises:
   a body-forming resin;
   a polymerizable compound configured to cross-link the body-forming resin upon polymerization; and
   a polymerization initiator.

3. The composition of claim 1, wherein the conductive particles are generally spherical having a diameter between about 2 µm and about 10 µm.

4. The composition of claim 1, wherein the at least one of the conductive particles is substantially larger than the nonconductive particles attached thereto.

5. The composition of claim 1, wherein the nonconductive particles are generally spherical having a diameter, which is from about 1/30 to about 1/5 of the diameter of the at least one of the conductive particles.

6. The composition of claim 1, wherein a density of the nonconductive particles on the surface of the at least one of the conductive particles is in a range of about 1 to about 550 E.A/µm².

7. The composition of claim 1, wherein the at least part of the nonconductive particles has an aspect ratio of less than about 1.5.

8. The composition of claim 1, wherein the at least part of the nonconductive particles has a coefficient of variation of less than about 30%.

9. The composition of claim 1, wherein the coating layer is interposed between the core and the surface of the at least one of the conductive particles.

10. The composition of claim 1, wherein the core comprises at least one material selected from the group consisting of silica, divinylbenzene, 1,4-divinyloxybutan, divinylsulfone, diallylphthalate, diallylacrylamide, triallyl(iso)cyanurate, triallyltrimellitate, (poly)ethylene glycol, di(meth)acrylate, (poly)propylene glycol, di(meth)acrylate, pentaerythritol tetra(meth)acrylate, pentaerythlytol tri(meta)acrylate, pentaerythritol di(meth)acrylate, trimethylolpropane tri(meta)acrylate, dipentaerythritol hexa(meth)acrylate, dipentaerythritol penta(meth)acrylate, glycerol tri(meta)acrylate, styrene, ethyl vinyl benzene, a-methylstyrene, m-chloromethylstyrene, styrene sulfonic acid, methyl(meth)acrylate, ethyl(meth)acrylate, propyl(meth)acrylate, n-butyl(meth)acrylate, isobutyl(meth)acrylate, t-butyl(meth)acrylate, 2-ethylhexyl(meth)acrylate, n-octyl(meth)acrylate, lauryl(meth)acrylate, stearyl(meth)acrylate, 2-hydroxyethyl(meth)acrylate, polyethylene glycol(meth)acrylate, methoxypolyethylene glycol(meth)acrylate, glycidyl(meth)acrylate, dimethylaminoethyl(meth)acrylate, diethylaminoethyl(meth)acrylate, vinyl acetate, vinyl propionate, vinyl butylate, vinyl ether, allyl butyl ether, allyl glycityl ether, (meth)acrylic acid, maleic acid, alkyl(meth)acrylamide, (meth)acrylonitrile, methacryloxy propyltrimethoxysilane, and methacryloxy propylethoxysilane.

11. The composition of claim 1, wherein the polymer includes a material selected from the group consisting of polystyrene derivatives, polyalkyl(meth)acrylate, and poly(meth)acrylonitrile.

12. The composition of claim 1, wherein at least one of the conductive particles comprises:
   a nonconductive core; and
   at least one conductive layer coated over the nonconductive core.

13. The composition of claim 12, wherein the at least one conductive layer comprises:
   a first layer coated over the nonconductive core, the first layer comprising a first conductive material; and
   a second layer coated over the first layer, the second layer comprising a second conductive material different from the first conductive material.

14. An anisotropic conductive film comprising the composition of claim 1.

15. The anisotropic conductive film of claim 14, wherein a density of the plurality of conductive particles in the film is about 5,000 to about 80,000 E.A/mm².

16. A method of making particles for use in an anisotropic conductive film, comprising:
   providing a conductive particle having a surface;
   providing a plurality of nonconductive particles, at least one of the nonconductive particles comprising a core and a coating layer over the core; and
   attaching the nonconductive particles onto the surface of the conductive particle such that the coating layer attaches the core onto the surface of the conductive particle while partially exposing the core, wherein the coating layer includes a polymer.

17. An electronic device, comprising:
   a first circuit comprising a first electrode;
   a second circuit comprising a second electrode; and
   an anisotropic conductive film interconnecting the first and second circuits, the anisotropic conductive film comprising a polymer resin and at least one anisotropic conductive connection between the first and second electrodes, the at least one anisotropic conductive connection comprising at least one particle, the at least one particle comprising:
   a conductive core having a surface, and
   a plurality of nonconductive particles attached to the surface of the conductive core, wherein at least part of the plurality of nonconductive particles comprises a core and a coating layer over the core, wherein the coating layer partially exposes the core, wherein the coating layer includes a polymer, and
   wherein the conductive core electrically contacts both the first and second electrodes.

18. The device of claim 17, wherein the device comprises a display device.

19. The device of claim 17, wherein two opposingly located portions of the conductive core contact the first and second electrodes.

20. A method of making an electronic device, comprising:
   providing an intermediate product of an electronic device, the intermediate device comprising first and second electrically conductive portions;
   placing the composition of claim 2 between the first and second electrically conductive portions;
   pressing the first electrically conductive portion against the second electrically conductive portion such that at least one of the plurality of nonconductive particles moves from its original position, allowing portions of the surface of the at least one of the conductive particles contact the first and second electrically conductive portions; and
   polymerizing at least part of the polymerizable compound.

* * * * *